(12) United States Patent
Lee et al.

(10) Patent No.: US 7,470,935 B2
(45) Date of Patent: Dec. 30, 2008

(54) LED PACKAGING

(75) Inventors: Ming-Shun Lee, Taipei (TW); Ping-Ru Sung, Taipei (TW)

(73) Assignee: Taiwan Oasis Technology Co., Ltd., Taipei (TW)

( * ) Notice: Subject to any disclaimer, the term of this patent is extended or adjusted under 35 U.S.C. 154(b) by 0 days.

(21) Appl. No.: 11/267,509

(22) Filed: Nov. 7, 2005

(65) Prior Publication Data
US 2007/0102717 A1   May 10, 2007

(51) Int. Cl.
*H01L 33/00* (2006.01)
(52) U.S. Cl. .................... 257/98; 257/99; 257/E51.018
(58) Field of Classification Search ................. 257/100, 257/676, 79, 99, 103, 98, 687, 710, 789, 257/102, E51.018, E51.022; 313/498, 487, 313/486
See application file for complete search history.

(56) References Cited

U.S. PATENT DOCUMENTS 6,858,880 B2 *   2/2005   Horiuchi et al. ............. 257/100
2004/0061433 A1 *   4/2004   Izuno et al. .................. 313/498

* cited by examiner

*Primary Examiner*—Davienne Monbleau
*Assistant Examiner*—Hoa B Trinh
(74) *Attorney, Agent, or Firm*—Troxell Law Office, PLLC

(57) ABSTRACT

An LED packaging construction has a chip embedded on a recessed carrier on substrate; conduction circuits with different electrodes being disposed to the peripheral of the carrier; electrode layer of chip being connected to conduction circuits with golden plated wire; fluorescent powder being filled in the carrier before mounting the colloid on the powder layer; coverage of colloid extending to substrate to complete LED packaging; larger binding range between colloid and substrate yielding better strength and increased light-emitting angle of the chip through the colloid.

9 Claims, 4 Drawing Sheets

LED PACKAGING

BACKGROUND OF THE INVENTION (a) Field of the Invention

The present invention is related to a packaging construction, and more particularly, to one that reliably packs LED to substrate while increasing the binding strength between the packaging colloid and the substrate.

(b) Description of the Prior Art

LED for providing features including compact in size, low power consumption, low temperature and long service life has been gradually replacing the conventional tungsten filament bulb. The basic construction of an LED involves having provided in a see-through packaging a carrier and multiple conduction terminals of different electrodes; a chip is fixed to the carrier, the electrode layer and those conduction terminals are connected by means of a golden plate wire; and each conduction terminal extends out of the see-through packaging to serve connection to the source.

With those conduction terminals are conducted, the light source generated by the chip emits the light. Of course, fluorescent material is disposed to the peripheral of the chip so that once the light from the chip passes through the fluorescent material its wave length is incorporated with that of the fluorescent material to emit the light in an expected color. Therefore, given with the improved process and technology, the LED may be made a lighting emitting device with a specific light color presentation results through the design of the fluorescent materials to further fast expand the marketplace of the LED.

SUMMARY OF THE INVENTION

The primary purpose of the present invention is to provide an improved LED packaging construction to reliably secure the LED on a substrate, and to provide larger binding range between the packaging colloid and substrate for better strength and increased light-emitting angle through the packaging colloid.

To achieve the purpose, a chip of the present invention is mounted to a recessed carrier disposed on a substrate, multiple conduction circuits of different electrodes are disposed on the substrate to the peripheral of the carrier; each conduction circuit and the electrode layer of the chip are connected by means of a golden plated wire; the carrier is then filled with a layer of fluorescent powder; finally, the packaging colloid is mounted on the layer of the fluorescent powder with an coverage extending to the substrate.

DETAILED DESCRIPTION OF THE PREFERRED EMBODIMENTS

Figure 1:
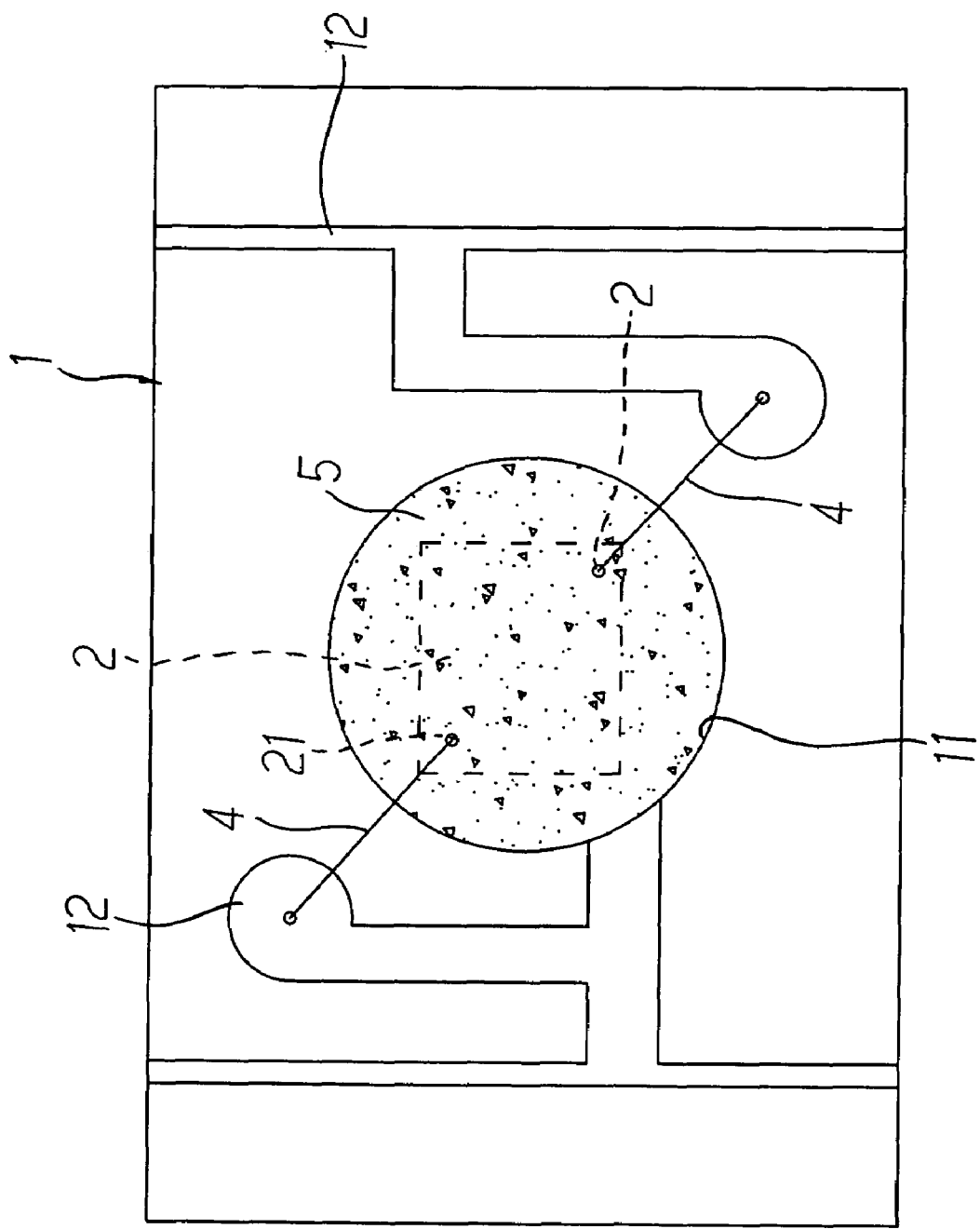
FIG. 1 is a schematic view of a construction of an LED of the present invention.
Figure 2:
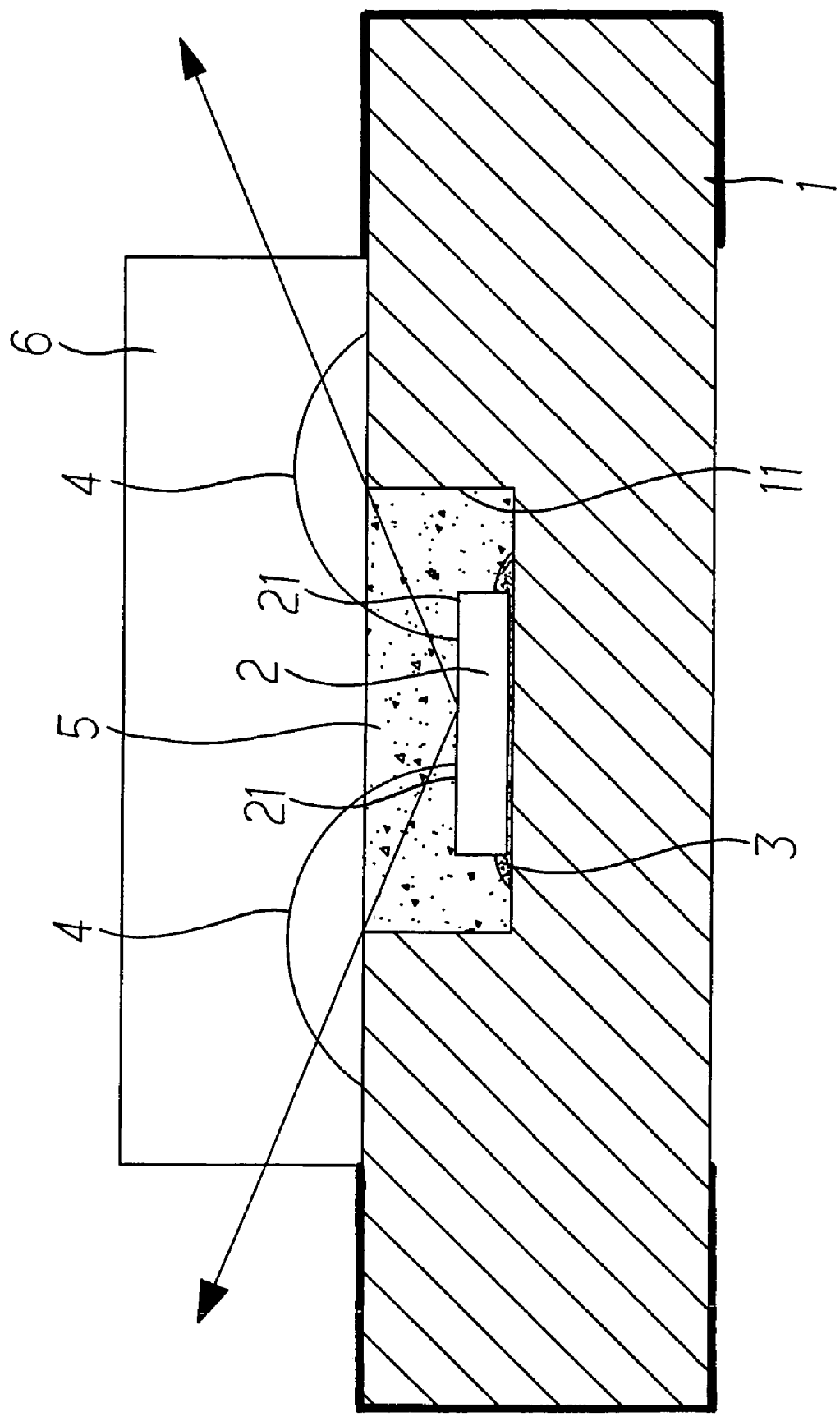
FIG. 2 is a schematic view showing another construction of an LED of the present invention.
Figure 3:
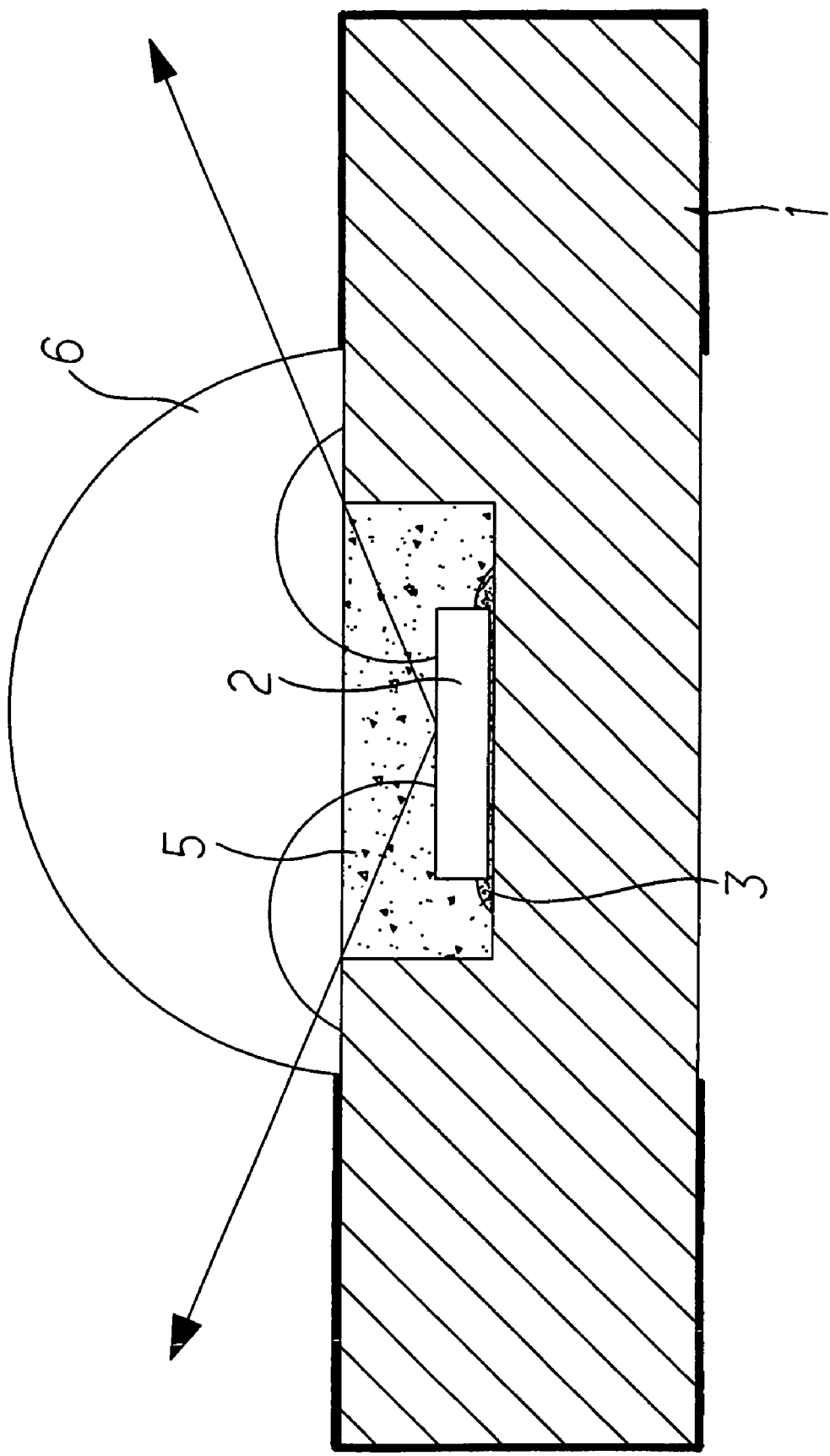
FIG. 3 is a schematic view of a construction of another preferred embodiment of the packaging colloid of the present invention.

An improved LED packaging construction of the present invention as illustrated in FIG. 1 and FIG. 2 has a recessed carrier 11 provided on a substrate 1. The substrate may be related to a plastic sheet or a circuit board. Multiple conduction circuits 12 of different electrodes are disposed on the substrate 1 to the peripheral of the carrier 11. A chip is mounted in the carrier 11 of the substrate 1. The chip 2 is fixed with adhesive to the bottom of the carrier. An electrode layer 21 of the chip and each conduction circuit 12 are connected by means of a golden plate wire 4 before the carrier 11 is filled with a fluorescent powder layer 5. Finally, a see-through packaging colloid 6 is mounted on the fluorescent powder layer 5. When conducted by the conduction circuits 12, the chip 2 generates a light source to emit the light through the fluorescent powder layer 5. The light from the chip 2 when passing through the fluorescent layer 5 has its wavelength incorporated with that from the fluorescent layer 5 to produce the light in expected color. If a pseudo-white light is desired, a blue chip is used to excite yellow fluorescent powders mixed in the fluorescent layer, or alternatively, the blue chip is used to excite red and green fluorescent powders mixed in the fluorescent powder layer to incorporate both red and green colors with the blue light from the chip to achieve the mixing result of three fundamental colors to produce a light color approaching white color with higher color development property.

In mounting the packaging colloid, the chip 2 fixed to the substrate is first turned upside down for 180 degrees and place it on a model of the packaging colloid 6 to such extent that the packaging colloid 6 is fixed to where above the chip 2 and the substrate 1. The coverage of the packaging colloid 6 extends from where above the carrier 11 to the substrate 1 to permit larger binding area between the packaging colloid 6 and the substrate 1, thus a better binding strength. Meanwhile, the light-emitting angle is increased since the packaging colloid 6 is capable of changing the light-emitting angle of the chip 2. The packaging colloid 6 as illustrated in FIG. 2 is made in a rectangular form, or alternatively, an arc form similar to a convex lens to increase the light-emitting angle of the chip 2.

Figure 4:
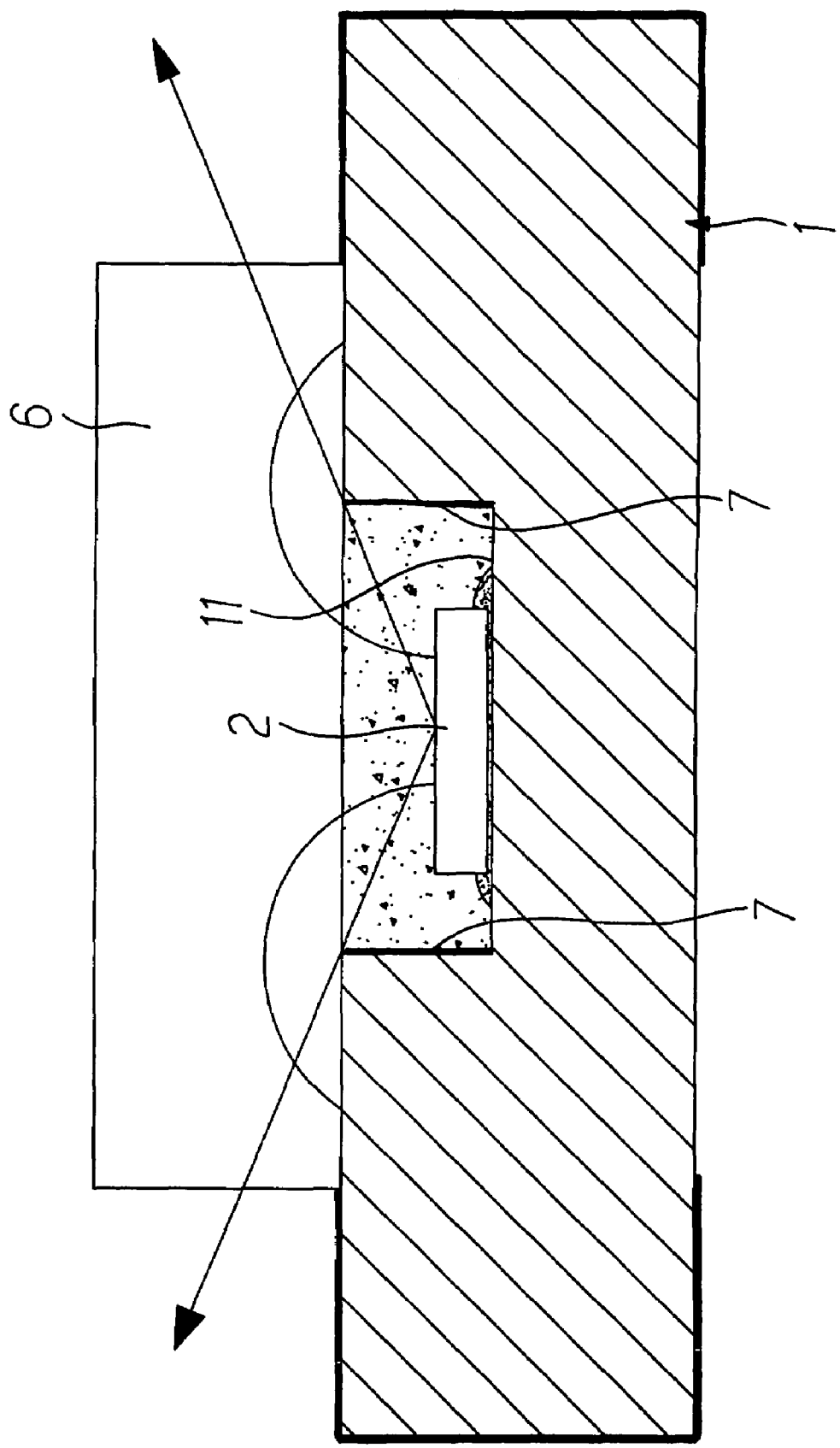
FIG. 4 is a schematic view of a construction of having provided in the carrier a metal reflection layer of the present invention.

Furthermore, a metal reflection layer 7 is plated in the carrier 11 as illustrated in FIG. 4. By taking advantage of light reflection provided by the metal reflection layer 7, the light emitting from the chip 2 is projected to where outside the packaging colloid 6 to effectively promote the luminance of the LED.

The prevent invention provides an improved light-emitting diode packaging construction, and the application for a utility patent is duly filed accordingly. However, it is to be noted that the preferred embodiments disclosed in the specification and the accompanying drawings are not limiting the present invention; and that any construction, installation, or characteristics that is same or similar to that of the present invention should fall within the scope of the purposes and claims of the present invention.

We claim:

1. An LED packaging construction comprising:
   a) a substrate having a recessed carrier;
   b) a chip embedded in the recessed carrier located in the substrate;
   c) a plurality of conduction circuits with different electrodes being located on a periphery of the recessed carrier, an electrode layer of the chip being connected to each of the plurality of conduction circuits with a golden plated wire;
   d) a fluorescent powder layer filling the recessed carrier; and
   e) a colloid mounted directly on coplanar surfaces of the substrate and the fluorescent powder layer, the colloid being a see through packaging colloid, each golden plated wire extending through the fluorescent powder layer and extending into the packaging colloid above the coplanar surfaces of the substrate and the fluorescent powder layer.

2. The LED packaging construction according to claim 1, wherein the substrate is a plastic sheet.

3. The LED packaging construction according to claim 1, wherein the substrate is a circuit board.

4. The LED packaging construction according to claim 1, further comprising a metal reflection layer plated in the recessed carrier.

5. The LED packaging construction according to claim 1, wherein the fluorescent powder layer contains yellow fluorescent powders.

6. The LED packaging construction according to claim 1, wherein the fluorescent powder layer contains yellow and green fluorescent powders.

7. The LED packaging construction according to claim 1, wherein the packaging colloid has a rectangular shape.

8. The LED packaging construction according to claim 1, wherein the packaging colloid has an exterior having a shape of an arc.

9. The LED packaging construction according to claim 1, wherein the colloid has a periphery larger than a periphery of the recessed carrier.

\* \* \* \* \*